United States Patent [19]

Baker

[11] Patent Number: 4,833,515
[45] Date of Patent: May 23, 1989

[54] IMAGING DEVICES COMPRISING PHOTOVOLTAIC DETECTOR ELEMENTS

[75] Inventor: Ian M. Baker, Romsey, Hants, England

[73] Assignee: U.S. Philips Corp., New York, N.Y.

[21] Appl. No.: 907,711

[22] Filed: Sep. 15, 1986

[30] Foreign Application Priority Data

Sep. 20, 1985 [GB] United Kingdom ............... 8623428

[51] Int. Cl.⁴ ........................................... H01L 29/78
[52] U.S. Cl. .................................. 357/24; 357/30
[58] Field of Search .................... 357/24, 25, 29, 30

[56] References Cited

U.S. PATENT DOCUMENTS 3,896,474 7/1975 Amelio et al. ..................... 357/30
4,521,798 6/1988 Baker ................................ 357/30

FOREIGN PATENT DOCUMENTS 1413092 11/1975 United Kingdom .

OTHER PUBLICATIONS

IEEE 1978 Technical Digest IEEE 1978 International Electron Device Meeting pp. 510–512.

Primary Examiner—Robert S. Macon
Attorney, Agent, or Firm—William L. Botjer

[57] ABSTRACT

In an imaging device, photocurrent generated by photovoltaic detector elements (1), e.g. cadmium mercury telluride photodiodes, is integrated in resettable capacitors (2), and an output signal (S) is derived by reading the potential of the capacitor (2) at the end of its integration period, e.g. using a source-follower MOST (3). In accordance with the invention, blooming-protection means (11,48,12) is coupled to each capacitor (2) to inhibit forward-biasing of the detector elements (1) and inversion of the capacitor potential when the capacitor (2) becomes fully discharged by excessive photocurrent. The blooming-protection means comprises a further gate (11) which has substantially the same threshold voltage as the injection gate (10) via which the photocurrent is injected into the capacitor (2). The further gate (11) which is connected at substantially the same control potential as the injection gate (10), is most conveniently formed together with the injection gate (10) as alternate integral parts of a common gate stripe (37) extending at one side of the capacitors (2). When a capacitor (2) becomes fully discharged, the further gate (11) couples it to a source (12) which supplies current to the capacitor (2) to stabilize the potential of both the capacitor (2) and its detector element (1) and so to protect against signal blooming.

9 Claims, 4 Drawing Sheets

IMAGING DEVICES COMPRISING PHOTOVOLTAIC DETECTOR ELEMENTS

BACKGROUND OF THE INVENTION

This invention relates to imaging devices, particularly but not exclusively so-called hybrid devices which may comprise infrared detector elements of, for example, cadmium mercury telluride coupled to capacitor means in, for example, a silicon circuit body. Such devices may be used in so-called "solid-state" video cameras and may operate at infrared wavelengths, for example in 3 to 5 μm (micrometers) or 8 to 14 μm bands.

In European patent application (EP-A) No. 0 128 828, there is disclosed an imaging device comprising (a) a plurality of photovoltaic detector elements which generate photocurrent in response to incident photon radiation, (b) capacitor means coupled to each detector element for integrating the current generated at that detector element during an integration period, the capacitor means being at least partially discharged by said current from the detector element, (c) an injection gate for controlling injection of the current from the detector element to the capacitor means, and (d) reset means for resetting the potential of the capacitor means to charge the capacitor means before the beginning of the integration period.

Such imaging devices disclosed in EP-A No. 0 128 828 differ from previous imaging devices using charge-coupled devices (CCDs) for processing and reading the signals from the detector elements. In particular by integrating the detector element current in such resettable capacitor means and by reading the capacitor potential using voltage-reading means switchably coupled to the capacitor means, it is possible to avoid certain disadvantages of charge-coupled devices in requiring high operating voltages, in introducing charge-transfer noise between successive stages of the CCD and in limiting the signal handling capability to values which are sometimes significantly less than what is desirable particularly for infrared imaging. Furthermore, the technology for fabricating CCDs is more complex than MOS transistor technology (for example, n channel MOST technology) with which the signal processing circuit of this type of imaging device can be fabricated.

The devices disclosed in EP-A No. 0 128 828 do not include any so-called "anti-blooming" or "blooming-protection" means. Such protection means are frequently necessary in charge-coupled devices to prevent excessive charge (generated by, for example, a very bright area of the scene being imaged) at one charge-storage site flowing over into neighbouring storage sites of the charge-coupled device so corrupting the signals represented by the charge at these neighbouring sites. Such charge overflow does not occur between the capacitors and transistors of the imaging devices disclosed in EP-A No. 0 128 828, due to the different mode of integrating and reading the photocurrent signal output from the detector elements in the devices of EP-A No. 0 128 828. For particular examples of blooming-protection means already known for charge-coupled devices reference is invited to U.S. Pat. No. 3,896,474 and to United Kingdom patent GB-A No. 1,413,092.

However it has been noted by the present inventor that even in the imaging devices of EP-A No. 0 128 828 excessive current generated at a detector element can still present difficulties. A capacitor means may not only become fully discharged by excessive charge generated at a detector element, but the potential of the capacitor means may then start to invert. This excessive photocurrent can change the bias condition for the detector elements. Thus, for example, infrared imaging devices for 3 to 5 μm or 8 to 14 μm wavelength operation may be based most conveniently on photovoltaic infrared detector elements operated in zero-bias condition and formed in a body of suitable infrared sensitive material, for example cadmium mercury telluride. Excessive photocurrent at one such detector element can not only invert the capacitor potential but also forward bias the photovoltaic element which may then inject charge carriers into a common region of the infrared sensitive body where they interfere with the other detector elements and the charge generated by the incident radiation at these other detector elements.

SUMMARY OF THE INVENTION according to the present invention, there is provided an imaging device comprising (a) a plurality of photovoltaic detector elements which generate photocurrent in response to incident photon radiation, (b) capacitor means coupled to each detector element for integrating the current generated at that detector element during an integration period, the capacitor means being at least partially discharged by said current from the detector element, (c) an injection gate for controlling injection of the current from the detector element to the capacitor means, and (d) reset means for resetting the potential of the capacitor means to charge the capacitor means before the beginning of the integration period, the device being characterised in that blooming-protection means is coupled to each capacitor means to inhibit inversion of the potential of the capacitor means when the current generated at the detector element exceeds a level sufficient to discharge fully the capacitor means, and in that the blooming-protection means comprises a further gate which has substantially the same threshold voltage as the injection gate and which is connected at substantially the same control potential as the injection gate so as to become activated when the capacitor means becomes fully discharged by excessive current generated at the detector element, which further gate when activated couples the capacitor means to a source supplying compensating current to the capacitor means to stabilize the potential of the capacitor means and of its detector element by compensating for the excessive current generated by the detector element.

By providing blooming-protection means in such an imaging device in accordance with the invention the potential of the capacitor means can be stabilized (by compensating for the excessive current in the detector element coupled to that capacitor means), and so the bias condition of that detector element can be stabilized to protect against signal blooming. Furthermore such blooming-protection means can be incorporated in a compact arrangement in the device without occupying excessive space in the layout of a circuit body. Thus, in a particularly compact arrangement, the injection gates and the further gates may simply be alternate integral parts of a common gate stripe extending at one side of the capacitor means. However layouts with separate gates may be adopted if so desired.

The injection gate and the further gate may be connected together to a common voltage supply. In this case, any noise in the voltage supply to the injection gate and to the further gate is common to both so that their performance is equally affected. Such a common voltage supply is obtained when the injection gate and further gate are integral parts of a common gate stripe.

Furthermore in order to avoid the occurrence of different threshold and gating characteristics as a result of using different fabrication processing, the injection gate and further gate are each preferably provided by insulated-gate field-effect transistors formed by the same technology for providing source, drain, gate and channel of the transistors. Thus, for example, when the injection gate and further gate are integral parts of a common gate stripe, an input zone for the detector element may be formed beside and in the same doping step as a zone via which the compensating current is supplied for the blooming protection.

Imaging devices in accordance with the invention may be designed for operation at visible light wavelengths or at infrared wavelengths. In the latter case, the detector elements may be most conveniently formed as infrared photodiodes having p-n junctions operated in zero-bias condition.

Blooming protection means in accordance with the invention may be incorporated in imaging devices such as disclosed in EP-A No. 0 128 828 which comprise capacitor means for the photocurrent integration and voltage-reading means (for example source-follower MOS transistors) to produce an output signal by reading the potential at the capacitor means.

However, in the imaging devices disclosed in EP-A No. 0 128 828, each cell (formed by a capacitor means coupled to a detector element) is provided with its own individual voltage-reading means (for example a source-follower MOS transistor M11, M21, M31, M41 in FIG. 1 of EP-A No. 0 128 828) which is individually sequentially switched (for example by an addressing MOS transistor M12, M22, M32, M42 in FIG. 2 of EP-A No. 0 128 828). There is also individual reset means (for example MOS transistors M3, M23, M33, M43 in FIG. 1) associated with each cell. Apart from other disadvantages relating to device characteristics and performance, the provision of so many circuit elements associated with each cell can occupy a large area of the signal processing circuit body, particularly but not only for two-dimensional arrays (for example FIG. 3 of EP-A No. 0 128 828). Incorporation of the characterising features of the present invention adds still further circuit elements (for example current source connections, even if alternate parts of an injection gate stripe are used to provide the blooming-protection further gates).

Preferably, therefore, the present invention is incorporated in a device having a less complex cell structure than those in EP-A No. 0 128 828. For this purpose there is a particularly convenient circuit arrangement based on capacitor storage and integration in which the voltage-reading and the reset means are each common for the plurality of detector elements, and in which the capacitor means of each detector element is switchably coupled by means of addressing and switching means to both said common voltage-reading means and said common reset means so as to switch each capacitor means sequentially to the common voltage-reading means and to reset sequentially the reference voltage level at each capacitor means and at the common voltage-reading means. This provides a compact circuit element structure for reading and resetting all the capacitor means so that additional circuit elements (for example blooming-protection source zones and/or connections and, if desired, additional further gates) can be more readily incorporated in accordance with the present invention. It is also possible to include even further circuit elements to improve or extend the device performance (for example, an expanded capacitor arrangement for increasing or varying the integration capacity and/or for providing alternately switchable capacitor means for each detector element). Furthermore, such a signal-processing circuit having common voltage-reading means and common reset means can be interfaced in a compact arrangement with a switchable two-dimensional array of detector elements.

Thus, the capacitor means of each detector element may comprise at least two capacitors connected in parallel, and at least one of the capacitors may have means permitting its connection to or disconnection from the other(s) so permitting a higher or lower total storage capacity to be obtained when so desired for the device application. This provides a more versatile signal processing circuit and can increase the dynamic range of the imaging device. The increased storage capacity obtained by connecting two or more capacitors in parallel may be used when looking at a hotter scene or even a scene with a hot spot so that this increased storage capacity may even be used in cooperation with the blooming-protection means to cope with excessive photocurrent in a detector element. Such increased storage capacity may also be employed when looking (i.e. integrating) for a longer time at a scene, since this also results in an increased signal from the detector elements. Another situation in which this facility can be useful is the fabrication of imaging devices operating at different infrared wavelengths. Thus, for example a large signal can generally be obtained from a scene with cadmium mercury telluride detector elements designed to operate in the 8 to 14 $\mu$m wavelength band rather than the 3 to 5 $\mu$m wavelength band. This variable capacitance facility permits either type of detector element to be coupled to the capacitor means in a device in accordance with the invention.

A pair of capacitor means may be switchably coupled in parallel between each detector element and a signal deriving means to integrate current from the detector element alternately at the first and second capacitor means of the pair. This permits one of the first and second capacitor means to be coupled to voltage-reading means while the other is coupled to the detector element. Thus, each detector element can be operated the whole time for infrared detection without its signal being lost (i.e. not integrated) when reading the previous output signal from that detector element. In this case a pair of said blooming-protection further gates may be associated with said pair of capacitor means and may be connected together to a common control voltage supply. An electrode connection located between said pair of said further gates may be connected to the compensating-current source for blooming protection and so may become coupled to either of the first and second capacitor means when either of said pair of further gates becomes activated as a result of the first or second capacitor means becoming fully discharged by excessive current generated at the detector element.

As mentioned hereinbefore, the signal processing circuitry of an imaging device in accordance with the present invention can be interfaced without difficulty to a plurality of detector elements arranged as a two-dimensional array. The detector elements may be switchably connected via respective switches in a two-dimensional array of switches to signal paths which are coupled to the capacitor means at least via the injection gates.

BRIEF DESCRIPTION OF THE DRAWINGS

These and other features in accordance with the invention will be illustrated more specifically in embodiments of the invention now to be described, by way of example, with reference to the accompanying diagrammatic drawings, in which.

Figure 1:
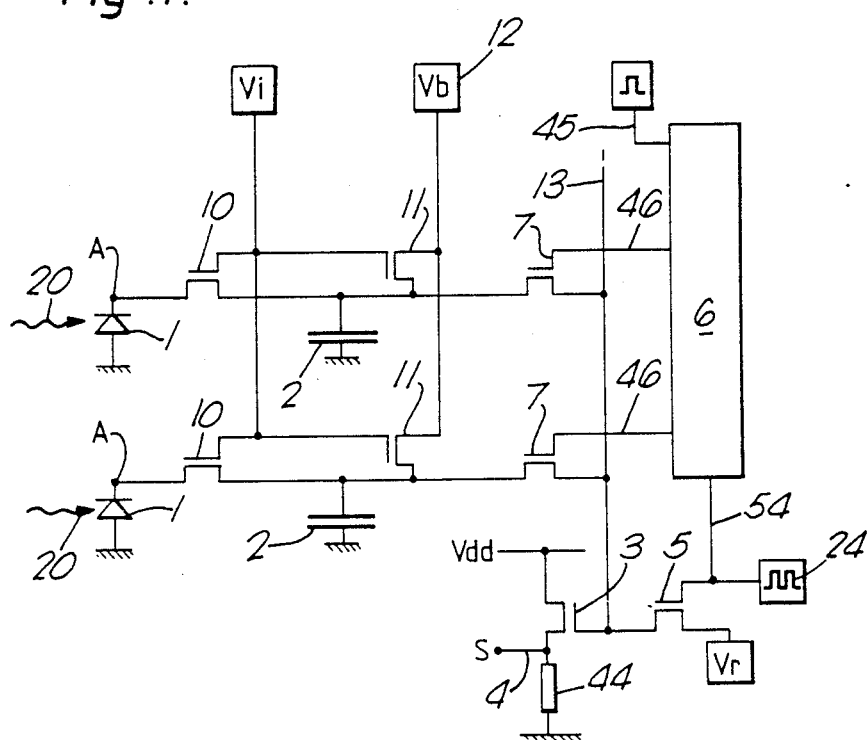
FIG. 1 is a circuit diagram of an infrared imaging device in accordance with the invention.

It should be noted that all these Figures are diagrammatic. The plan and sectional views of FIGS. 3, 4, 5 and 6 are not drawn to scale but the relative dimensions and proportions of parts of these Figures have been shown exaggerated or diminished for the sake of clarity and convenience in the drawings. The same reference signs as used in one embodiment are generally used when referring to corresponding or similar parts in other embodiments.

DETAILED DESCRIPTION OF THE PREFERRED EMBODIMENT

The infrared imaging device of FIG. 1 comprises a plurality of infrared detector elements 1 which generate photocurrent in response to incident infrared radiation 20. Capacitor means 2 are coupled to each detector element 1 for integrating the current generated at that detector element 1 during an integration period. An injection gate 10 controls injection of the current from the detector element 1 to the capacitor means 2. Voltage-reading means 3 are coupled between the capacitor means 2 and a signal output 4 to produce an output signal S by reading the potential at the capacitor means 2 corresponding to the amount of current integrated at the capacitor means 2. Reset means 5 are coupled to the capacitor means 2 for resetting the capacitor means 2 to a reference voltage level Vr before the beginning of each integration period. Addressing and switching means 6,7 permit the output signals S corresponding to the plurality of detector elements 1 to occur sequentially at the signal output 4 and permit the capacitor means 2 of the detector elements 1 to be sequentially reset. In this device, the voltage-reading means 3 and the reset means 5 are each common for the plurality of detector elements 1, and the capacitor means 2 of each detector element 1 is switchably coupled by means of the addressing and switching means 6,7 to both the common voltage-reading means 3 and the common reset means 5 so as to switch each capacitor means 2 sequentially to the common voltage-reading means 3 and to reset sequentially the reference voltage level Vr at each capacitor means 2 and at the common voltage-reading means 3.

This form of device illustrated in FIG. 1 and having common voltage-reading means and common reset means presents a significant improvement in performance over the devices disclosed in EP-A No. 0 128 828 having individual voltage-reading means and individual reset means for each capacitor means. Because the device of FIG. 1 does not have these individual circuit elements associated with each capacitor means, it is much easier (in terms of layout and body area) to incorporate further circuit elements in accordance with the present invention into the FIG. 1 form of device rather than into those disclosed in EP-A No. 0 128 828. Thus, there is present in the FIG. 1 arrangement, in accordance with the present invention, blooming-protection means 11,12 coupled to each capacitor means 2 to inhibit inversion of the potential of the capacitor means 2 when the current generated at the detector element 1 exceeds a level sufficient to discharge fully the capacitor means 2. The blooming-protection means comprises a further gate 11 which has substantially the same threshold voltage as the injection gate 10 and which is connected at substantially the same control potential Vi as the injection gate 10 so as to become activated when the capacitor means 2 becomes fully discharged by excessive current generated at the detector element 1. This further gate 11 when activated couples the capacitor means 2 to a source 12 of bias Vb supplying compensating current to the capacitor means 2 to stabilize the potential of the capacitor means 2 and of its detector element 1 by compensating for the excess current generated by the detector element 1.

The drawings only show, for the sake of convenience, a small number of detector elements 1 and their signal processing. However, in practice, these imaging devices will have a large number of such detector elements 1 and corresponding signal processing circuitry. Thus, the devices of FIGS. 1 and 2 may be used in infrared video cameras having, for example, linear arrays of 32 or 64 or even 128 detector elements 1 across which the scene which is being viewed in the infrared is imaged and raster-scanned in known manner by means of lenses and progressively stepped reflectors. Depending on the type of camera and imaging system, the scan direction may be in the longitudinal direction of the linear array or perpendicular to that direction.

The detector elements 1 may be photovoltaic diodes of known type formed in a common body 30 (see FIG. 3) of cadmium mercury telluride, the composition of which can be chosen for operation in, for example, the 3 to 5 $\mu$m waveband or the 8 to 14 $\mu$m waveband. The bulk of the body 30 may be of p type material at the detector operating temperature, for example 70° K. for the 8 to 14 $\mu$m waveband. Each detector element may comprise an n type region 31 forming a p-n diode junction with the p type bulk. The common p type bulk of the detector elements 1 may be connected to earth potential, and the individual output signals of each photovoltaic element 1 are taken as currents from the n type regions 31 via, for example, wire connections 32 to the inputs A of a silicon circuit body 33 containing the signal processing circuitry. For the sake of convenience, FIG. 3 does not show electrode metallizations for the n type regions 31 and for the p type bulk of body 30, but these may be provided in a variety of known manners.

Figure 2:
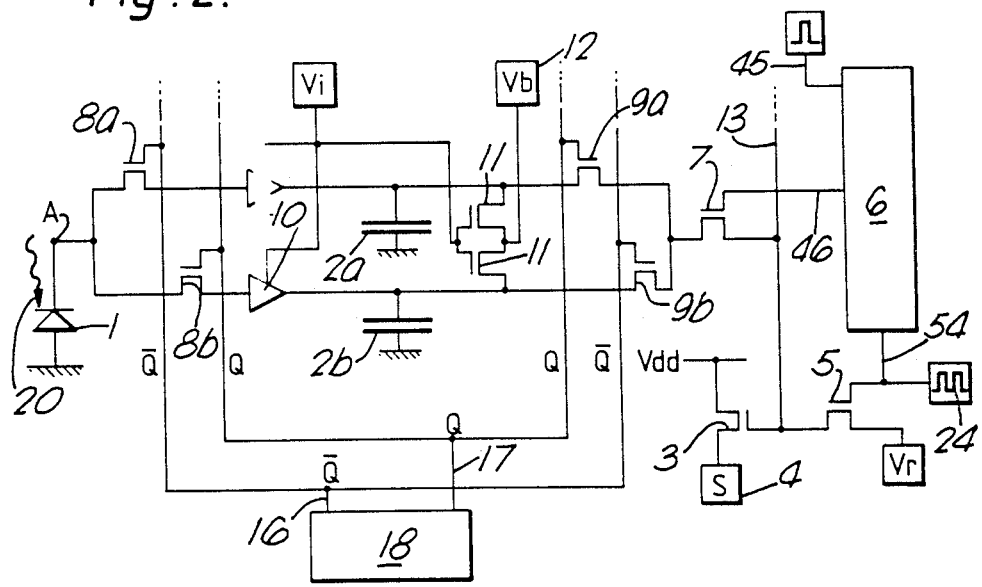
FIG. 2 is a circuit diagram of a modification of the device of FIG. 1 which includes alternately switchable storage capacitors for each detector element.
Figure 3:
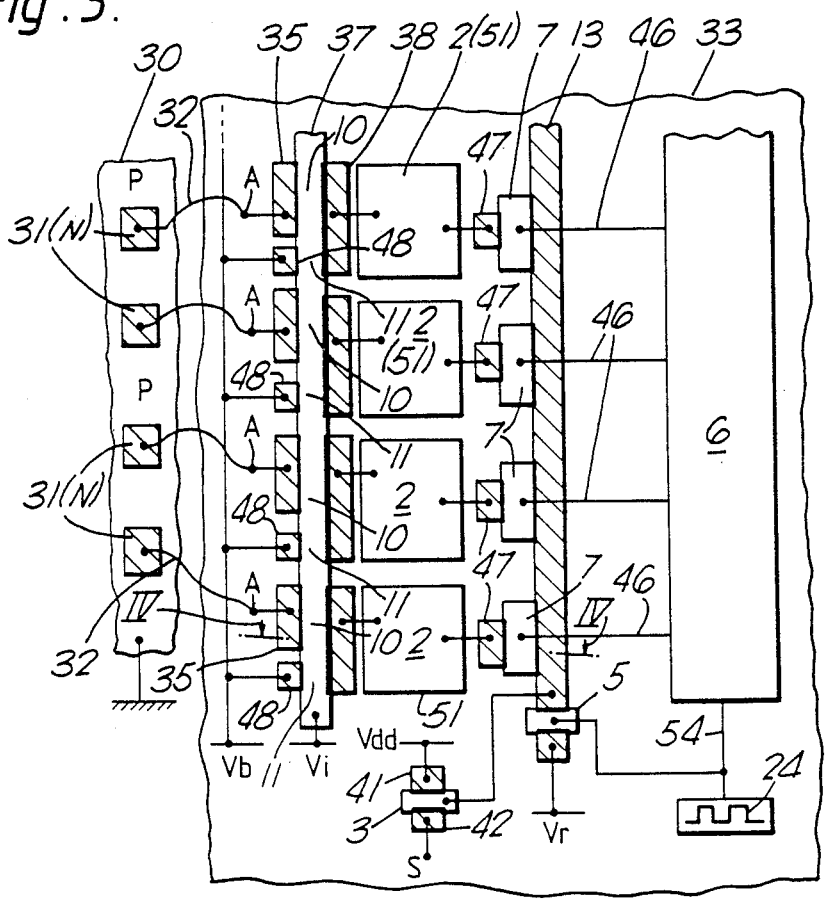
FIG. 3 is a plan view of one possible layout for part of the device of FIG. 1.
Figure 4:
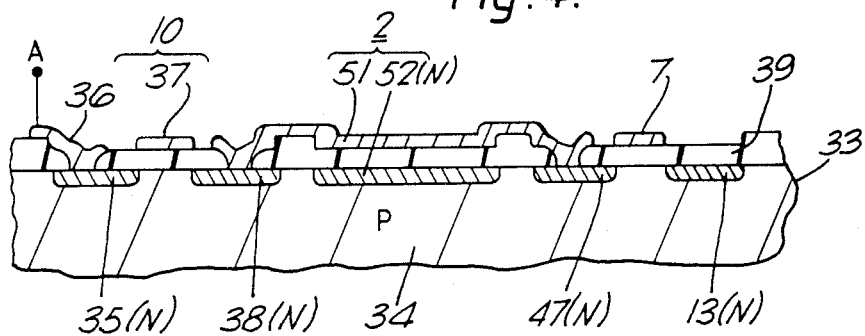
FIG. 4 is a cross-section on the line IV—IV of FIG. 3 showing one form of integrated circuit technology which may be used to fabricate the signal-processing circuitry part of the device of FIG. 1.

All the signal processing circuitry illustrated in FIGS. 1 and 2 may be formed in a single silicon circuit body 33. The capacitor means 2 of the detector elements 1 are located in a row and are switchably coupled to a common signal line 13 at a location along which the common voltage-reading means 3 and common reset means 5 are connected. The injection gate 10 of each detector element 1 is located on the other side of the row of capacitor means 2 and extends parallel to the line 13. As shown in FIGS. 3 and 4, the injection gates 10 may be fabricated as insulated-gate field-effect transistors having separate source zones 35 connected to each input A by electrode connections 36, insulated gates 10 formed by a common gate stripe 37 for the row of capacitor means 2, and separate drain zones 38 for each capacitor means 2. These transistors and, if so desired, the remainder of the signal-processing circuitry in body 33 may be formed using, for example, known n channel MOS integrated circuit technology. Thus, source and drain zones 35 and 38 may be n type regions in a p type portion of the silicon body 33, the individual transistors are isolated from each other in known manner at active areas defined by a thick field oxide layer 39 at the body surface, while a much thinner insulating layer is present below the active areas of the gates formed by tracks of, for example, doped polycrystalline silicon or a metal silicide.

In the form shown by way of example in FIGS. 3 to 6, the common signal line 13 is an n type stripe in the p type portion of the silicon body 33. In this case, the reset gate 5 can be a transistor switch formed by an insulated gate over a gap in the n type stripe 13 the interrupted parts of which provide the source and drain of the transistor, for example at one end of the line 13. In the plan views of FIGS. 3 and 5, n type regions are hatched, whereas insulated gate areas are unhatched. The common voltage-reading means 3 is (as shown in FIGS. 1 and 2) a source-follower field-effect transistor having an insulated gate 43 connected to the common signal line 13, an n type drain zone 41 connected to a voltage supply line Vdd (for example, at about 9 volts), and an n type source zone 42 connected to earth potential via a load transistor 44. This load 44 may be an n channel field effect transistor whose insulated gate and source are connected together in known manner. For the sake of convenience this load transistor structure is not shown in FIG. 3. The signal output 4 of the devices of FIGS. 1 and 2 is taken from the source zone 42 of the common voltage-reading transistor 3. An amplifier (which may also be formed in the body 33) may be connected to this output 4 to amplify the output signal S.

The addressing and sequential switching of the capacitor means 2 to the common signal line 13 is effected by means of a high speed shift register 6 having sequential outputs 46 connected to a plurality of insulated gates 7 located between the capacitor means 2 and the signal line 13. These gates 7 may be fabricated as transistor structures illustrated in FIGS. 3 to 6 having n type individual source zones 47 and a common drain zone formed by the n type signal line 13. The sequence of outputs 46 from the shift register 6 includes an initial (or final) output 45 which provides a line synchronisation pulse for the device signal S when the sequentially shifted output pulse from the register 6 appears at the output 45.

The capacitor means 2 for temporarily storing and integrating the charge signals from the detector elements 1 may be constructed in various ways. Thus, for example, using n channel MOS integrated circuit technology, the separately-connected storage plates of the individual capacitors may be formed by separate n type regions (for example regions 57 of FIGS. 6 and 7) but insulated from an overlying insulated gate stripe which is common for all the capacitors and which is connected to earth potential. However, the capacitance of the capacitor constructed in this way also includes that of the p-n junction between the n type region and the p type body portion 34, and this p-n junction capacitance varies with voltage. FIGS. 3 and 4 illustrate an inverted construction in which the separately-connected storage plates are insulated gate areas each connected between n type side regions formed by a drain region 38 of an injection gate transistor and an n type source region 47 of an addressing transistor 7. In this case there is a common n type stripe 52 which forms the bottom plate of the capacitors 2 and which is connected to earth potential. This construction is more complicated and may occupy more space, but its capacitance is much more stable with voltage. It is also possible to form the capacitor 2 wholly deposited on the surface of the body 33, for example as a metal plate deposited on a dielectric layer on a polycrystalline silicon layer in the insulating layer 39.

Due to its advantageous design, the operation of the device and circuit of FIG. 1 is comparatively simple. A low constant voltage Vi (for example, about 1 volt) is applied to the injection gates 10 to operate the input transistors 35-10-38 in known manner in the condition where the channel current of the transistor is controlled by the gate-to-source voltage so as to equal the detector element photocurrent, thereby maintaining the detector elements 1 in a zero-bias condition. In this way the injection gates 10 serve to stabilize the operation of the photodiodes 1 illuminated by the radiation 20.

The injected current signal is integrated on the capacitor 2. For this purpose, the capacitor 2 is charged before the beginning of the integration period by resetting its potential to the reference level Vr (for example, about 5 volts), after which it is isolated from the line 13 for the integration period. The capacitor 2 becomes at least partially discharged during the integration period by the current signal from the detector elements. The potential corresponding to the charge state of each capacitor 2 at the end of its integration period is read by coupling that capacitor 2 via its addressing gate 7 to the gate of the source-follower transistor 3. The gates 7 are sequentially addressed by an output pulse which appears sequentially on the outputs 46 of the shift register 6. In the arrangement illustrated in FIGS. 1 and 2, a source of clock voltage pulses 24 is connected to both the reset gate 5 and to an input 54 of the shift register 6. The potential of one capacitor 2 is read in the time interval between the pulses 24.

The threshold voltage of the reset gate 5 is chosen such that the rising edge of each pulse 24 triggers the gate 5 so that the reference voltage Vr is applied via the open addressing gate 7 to that one capacitor 2 which has just been read so resetting its voltage for its next integration period. At the same time (because the transistor drain of the reset gate 5 is connected to the insulated gate of the source-follower transistor 3) the reference voltage level Vr is also applied to the transistor 3 so that its output signal S changes from a value corresponding to the signal from that one capacitor to a value corresponding to Vr. In this manner the output signal from each capacitor is measured against the reset voltage level Vr (and not earth potential) so tending to cancel any variation occurring in the supplied level Vr due to, for example, noise.

The input 54 of the shift register 6 is so designed as to cause the falling edge of each pulse 24 to clock the shift register 6 so that the output pulse now appears on the next output 46 in the sequence. This triggers the switchable coupling of the next capacitor 2 in the sequence to the line 13 so that the potential corresponding to the charge state of this next capacitor is read by the source-follower transistor 3.

If the device of FIG. 1 is used to view a scene with a very hot spot, the current generated by at least one of the detector elements 1 may exceed a level sufficient to discharge fully the associated capacitor 2, and this excess current could invert the capacitor potential (so that it became negative) in the absence of anti-blooming means 11,12. The excess current can forward bias the p-n junction of this detector element so that it injects electrons into the p type bulk of the cadmium mercury telluride body 30 thereby producing an excessive charge signal at least at neighbouring detector elements 1 and possibly along most of the detector element row. However the device of FIG. 1 (and that of FIG. 2) is protected against such a blooming effect by having a further gate 11 between each capacitor 2 and a source 12 of compensating current to stabilize the potential of the capacitor 2 and its detector element 1.

The further gate 11 has the same threshold voltage as the injection gate 10 and is connected at the same control potential Vi. This is achieved in a simple manner in the layout of FIG. 3 by making the injection gates 10 and blooming-protection gates 11 as alternate integral parts of the common insulated gate stripe 37 and by forming source, drain and channel of the transistor structures which provide the injection gate 10 and further gate 11 using the same technology and in the same processing steps. Thus, the gates 11 form part of insulated-gate field-effect transistors each having source and drain formed by a separate n type region 48 and an n type region 38 which is common with the injection gates 10. Direct coupling between regions 35 and 48 is prevented in known manner by a channel-stop or other form of circuit isolation extending under the parts of the gate stripe 37 between the active gate parts 10 and 11. All these n type regions 48 are connected by a metallization track to a supply line 12 at a positive potential (Vb) which may be substantially the same as the reset reference voltage level (Vr), for example 5 volts. Thus, when the associated capacitor 2 is reset the blooming-protection transistor 11 is in a hard off condition due to the significant effective negative potential of its gate, i.e. (Vi−Vr), for example about minus 4 volts, with respect to region 38.

If now a detector element 1 becomes forward biased and the potential of the associated capacitor 2 starts to go negative, the associated region 38 of the blooming-protection gate 11 will start to become negative. As a result, the effective gate potential Vi is now positive with respect to the region 38 so that the blooming-protection transistor formed by the gate 11 will start to conduct so coupling the capacitor 2 to the current supply 12. In this situation the supply 12 provides compensating current to the capacitor 2 to stabilize the potential of both the capacitor 2 and its detector element 1 at about zero volts by compensating for the excess photocurrent. In this way the tendency is avoided for excessive current at a detector element to forward bias the p-n junction of that element.

The same basic circuit operation of the device described with reference to FIG. 1 occurs in the device of FIG. 2, regarding its detector elements 1, injection gates 10, capacitor means 2, blooming-protection gates 11, addressing gates 7, common voltage-reading transistor 3, reset gate 5 and shift register 6. In the device of FIG. 2, however, two alternately-switchable capacitors 2a and 2b are associated with each detector element 1 so that while one capacitor (for example, 2a) is coupled to the source-follower transistor 3 for reading its potential after integration, the other capacitor (2b) is coupled to the detector element 1 for integrating its current signal. The switching arrangement of input gates 8a and 8b and output gates 9a and 9b permits each detector element 1 to be operated the whole time for photodetection without its signal being lost (i.e. not integrated) when reading the previous output from that element 1. Therefore, in the device of FIG. 2, all the detector elements 1 can stare at the scene at the same time. For the sake of convenience, only one element 1 and the corresponding input A is illustrated in FIG. 2.

Figure 5:
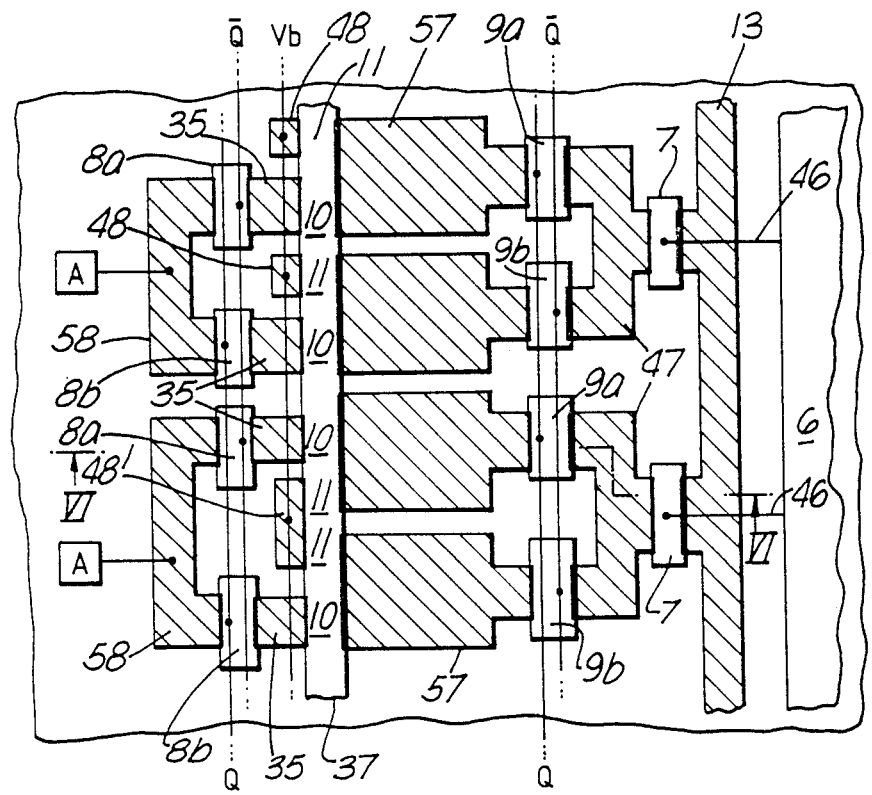
FIG. 5 is a plan view of part of the layout of FIG. 3, modified to provide alternately switchable storage capacitors as in FIG. 2.
Figure 6:
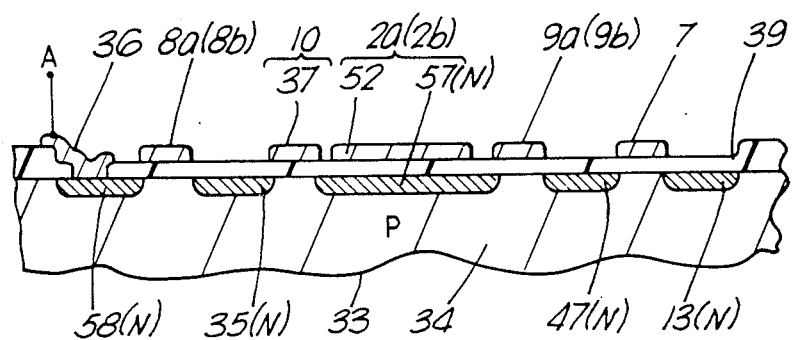
FIG. 6 is a cross-section on the line VI—VI of FIG. 5.

Each of the first and second capacitors 2a and 2b may be formed in the same manner as for the device of FIG. 1. In the example illustrated in FIGS. 5 and 6, each capacitor 2a or 2b comprises an individual n type region 57 in the p type body portion 34. Each capacitor region 57 is insulated from an overlying metal stripe 52 (not shown in FIG. 5) which forms a common top earthed plate of all the capacitors 2a and 2b and which extends parallel to the injection gate stripe 10. However, if desired, an inverse capacitor structure having a common n type stripe 52 (in the body portion 34), and separate insulated gate plates 51a and 51b connected between n type side regions may be provided instead for each capacitor 2a and 2b similar to that of FIGS. 3 and 4. Separate insulated gates 9a and 9b are present between the n type regions 57 and the n type region 47 of each addressing transistor 7 to form the alternately switchable output gates. Similarly, instead of the input A being to the n type regions 35 of the injection gate transistors 10, each input A is to an n type region 58 which is coupled to the individual regions 35 for the capacitors 2a and 2b by insulated gates 8a and 8b forming the alternately switchable input gates. It is usually preferable to include the input gates 8a and 8b between the detector element input A and the injection gate 10 as illustrated in FIGS. 2, 5 and 6, rather than between the injection gate 10 and the capacitor means 2a and 2b, because a common injection gate stripe 37 in this latter position may introduce confusion between the input signals from the detector elements 1 due to the large capacitance of the gate stripe 37. Individual connection regions 48 for the blooming protection means may be provided for each capacitor 2a or 2b or a more compact arrangement may be obtained by having common electrode connection regions 48′ located between the gates 11 of each pair of capacitors 2a or 2b. In practice, either individual regions 48 or common regions 48′ will normally be used for each pair 2a and 2b of capacitors in the device; however, both are illustrated for different capacitor pairs in FIG. 5 for the sake of convenience, rather than having two drawings.

As illustrated in FIG. 2, the switching arrangement 8a,8b,9a,9b is controlled by the inverse outputs 16 and 17 of one or more flip-flop circuits 18. One output signal $\overline{Q}$ (from 16) is the inverse of the other Q (from 17). Output 16 is connected to the input gate 8a and to the output gate 9b, whereas the output 17 is connected to the gate 8b and 9a. Thus, when Q is such as to switch on the transistors having the insulated gates to which it is applied, the capacitor 2a is coupled to the detector element 1 to integrate its current output but is isolated from the addressing gate 7 by the off state of the transistor switch having the insulated gate 9a, and the capacitor 2b is coupled to the addressing gate 7 but is isolated from the detector element 1 by the off state of the transistor switch having the insulated gate 8b.

Figure 7:
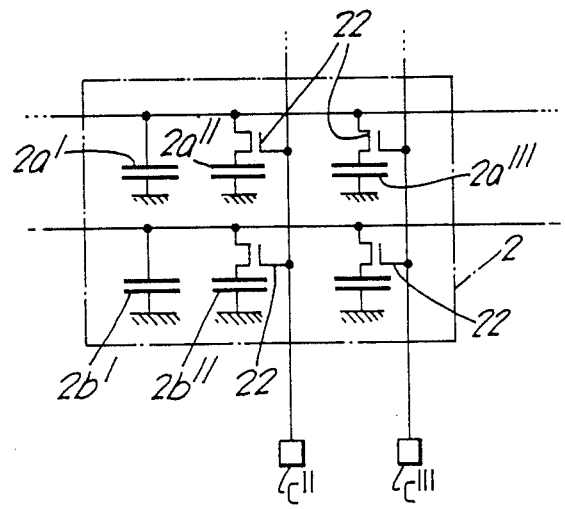
FIG. 7 illustrates a further modification of the capacitor means and blooming-protection means for a detector element of a device in accordance with the invention.

FIG. 7 illustrates a further modification for the capacitor means for each detector element input A. In this form, each of the first and the second capacitor means 2a and 2b in the alternate parallel arms of the FIG. 2 circuit comprises three capacitors (namely 2a', 2a", 2a''', and 2b', 2b", 2b''') connected in parallel. At least the capacitors 2a", 2a''', 2b" and 2b''' are coupled to the arms via transistor switches 22 the insulated gates of which are connected in pairs to control voltage sources C" and C'''. This allows each pair of capacitors (either 2a" and 2b", or 2a''' and 2b''') to be connected or disconnected from the other(s) so permitting a higher or lower total storage capacity to be obtained when so desired for the device application. This arrangement provides a more versatile signal processing circuit and can increase the dynamic range of the imaging device. The increased storage capacity obtained by connecting two or more capacitors (2a', 2a", 2a''') in parallel may be used when looking at a hotter scene or even a scene with a hot spot so that this increased storage capacity may even be used in cooperation with the blooming-protection means 11,12 to cope with excessive current from a detector element 1. Such increased storage capacity may also be employed when looking (i.e. integrating) for a longer time at a scene, since this also results in an increased signal from the detector elements. Another situation in which this facility can be useful is the fabrication of imaging devices operating at different infrared wavelengths. Thus, for example a large signal (for example up to 30 times more) can generally be obtained from a scene with cadmium mercury telluride detector elements 1 designed to operate in the 8 to 14 μm wavelength band rather than the 3 to 5 μm wavelength band. This variable capacitance facility (2a', 2a", 2a''', 2b', 2b", 2b''', 22) permits either type of detector element 1 to be coupled to the capacitor means 2 in a device in accordance with the invention. Although FIG. 7 illustrates three pairs of capacitors, similar devices may be designed with just two such pairs (for example 2a', 2b' and 2a" and 2b") for the device of FIG. 2, and in the case of FIG. 1 the capacitor 2 would be simply replaced by capacitors 2a', 2a" and, if desired, 2a''' but without pairing.

In the devices so far described with reference to FIGS. 1 to 7, the row of capacitor means 2 has been coupled to a linear array of detector elements 1. It will be appreciated that many array variations of the devices of FIGS. 1 to 6 are possible within the scope of the invention. Thus, for example the detector elements 1 may be arranged in two rows or, for example, an alternately staggering row and may be located between two signal-processing circuit bodies 33, each having a row of capacitor means 2 so that the different rows of detector elements 1 or alternate detector elements 1 may be connected to the different bodies 33. In some devices the detector elements 1 may be provided on or even in the signal-processing circuit body 33. Furthermore, the signal-processing circuitry of imaging devices in accordance with the invention may be interfaced to a two-dimensional array of detector elements 1.

Figure 8:
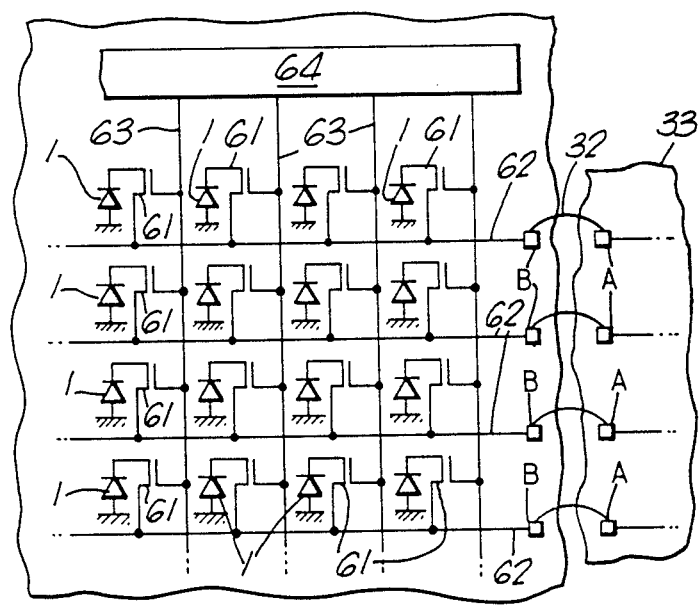
FIG. 8 is a circuit diagram of a two-dimensional array of detector elements and switching arrangement which may be incorporated as a modification in at least the device of FIG. 2.

FIG. 8 illustrates a two-dimensional array of photodiode detector elements 1 which are switchably connected via respective switches 61 to signals paths 62. Although only sixteen detector elements 1 and switches 61 are shown in FIG. 8, there will usually be many more, for example at least a 64×64 array or 128×128 array. The switches 61 may be insulated-gate field-effect transistors and are arranged in a two-dimensional array corresponding to that of the detector elements 1. Once again, the detector elements 1 may be of cadmium mercury telluride and they may be mounted by a variety of known techniques on a silicon circuit body comprising the switches 61 and signal paths 62. Two examples of suitable mounting and interconnection technologies are described in European patent application EP-A No. 0 061 803 which corresponds to U.S. Pat. No. 4,521,798 which describes the formation and connection of annular n type detector element regions around the side-walls of apertures in a p type body on a silicon circuit substrate, and in I.E.E.E. 1978 International Electron Devices Meeting, Washington D.C., pages 510 to 512 which describes indium bump connections between detector element regions at the bottom surface of an opposite conductivity type body also on a silicon circuit substrate.

The transistors 61 in each (horizontal) column are sequentially switched on by a pulse appearing sequentially on the outputs 63 of a shift register 64 which may be integrated into the same silicon circuit body as the switches 61. By this means, the detector elements 1 in each column are switched sequentially to the row of outputs B of the paths 62 which are connected to the inputs A of a signal processing circuit such as that shown in FIG. 2. When the array of FIG. 8 is connected to the circuit of FIG. 2, the signals from one line (vertical row) of detector elements 1 may be read from, for example, the capacitors 2a by the source-follower transistor 3 while the signals from the next line (vertical row) of detector elements 1 are being coupled to and integrated in the capacitors 2b. Thus, this imaging device has a line equivalent performance from each row of the two-dimensional array, with the same stare time (and integration time) for each detector element 1 in the line (vertical row). Since the individual switching transistors 61 and their connections can be fabricated with a very compact geometry it is possible to provide a large number of switches 61 and detector elements 1 in a closely packed array so that much larger arrays (in small areas) and higher spatial resolutions can be achieved with the imaging device of FIGS. 2 and 8, as compared with both CCD imaging devices and the FIG. 3 device of EP-A No. 0 128 828.

The array of FIG. 8 may be connected to the circuit of FIG. 1, if a pulse is applied to the injection gate 10 so as to isolate the capacitor 2 from the input A when its potential is being read by the transistor 3. However, the time for staring/integration would then be reduced by the time taken for scanning the line.

I claim:

1. An imaging device comprising (a) a plurality of photovoltaic detector elements which generate photo-current in response to incident photon radiation, (b) capacitor means coupled to each detector element for integrating the current generated at that detector element during an integration period, the capacitor means being at least partially discharged by said current from the detector element, (c) an injection gate for controlling injection of the current from the detector element to the capacitor means, and (d) reset means for resetting the potential of the capacitor means to charge the capacitor means before the beginning of the integration period, characterised in that blooming-protection means is coupled to each capacitor means to inhibit inversion of the potential of the capacitor means when the current generated at the detector element exceeds a level sufficient to discharge fully the capacitor means, and in that the blooming-protection means comprises a further gate which has substantially the same threshold voltage as the injection gate and which is connected at substantially the same control potential as the injection gate so as to become activated when the capacitor means becomes fully discharged by excessive current generated at the detector element, which further gate when activated couples the capacitor means to a source supplying compensating current to the capacitor means to stabilize the potential of the capacitor means and of its detector element by compensating for the excess current generated by the detector element.

2. A device as claimed in claim 1, further characterised in that, in plan view, the further gates and injection gates are alternate integral parts of a common gate stripe extending at one side of the capacitor means.

3. A device as claimed in claim 1 or claim 2, further characterised in that the injection gate and the further gate are connected together to a common voltage supply.

4. A device as claimed in claim 1 or claim 2, further characterised in that the injection gate and further gate are each provided by insulated-gate field-effect transistors formed by the same technology for providing source, drain, gate and channel of the transistors.

5. A device as claimed in claim 1 or claim 2, further characterised in that the source to which the capacitor means is coupled by said further gate is at substantially the same potential as that to which the capacitor means is reset at the beginning of the integration period.

6. A device as claimed in claim 1 or claim 2, further characterised in that there is common voltage-reading means for the plurality of capacitor means to produce output signals by reading the potential at said capacitor means which corresponds to the current integrated at each capacitor means, in that the reset means is also common for the plurality of detector elements, and in that the capacitor means of each detector element is switchably coupled by means of addressing and switching means to both said common voltage-reading means and said common reset means so as to switch each capacitor means sequentially to the common voltage-reading means and to reset sequentially the reference voltage level at each capacitor means and at the common voltage-reading means.

7. A device as claimed in claim 1 or claim 2, further characterised in that the capacitor means of each detector element comprises at least two capacitors connected in parallel, and at least one of the capacitors has means permitting its connection to or disconnection from the other(s) so permitting a higher or lower total storage capacity to be obtained.

8. A device as claimed in claim 1 or claim 2, further characterised in that the detector elements are formed in a body of cadmium mercury telluride, and the capacitor means and other signal-processing means for processing the signal from the detector elements are formed in at least one silicon circuit body.

9. A device as claimed in claim 1 or claim 2, further characterised in that the detector elements are infrared photodiodes having a p-n junction operated under zero bias.

* * * * *